United States Patent
Saito et al.

(10) Patent No.: US 9,698,141 B2
(45) Date of Patent: Jul. 4, 2017

(54) SEMICONDUCTOR DEVICE

(71) Applicant: KABUSHIKI KAISHA TOSHIBA, Tokyo (JP)

(72) Inventors: Yasunobu Saito, Nomi Ishikawa (JP); Toshiyuki Naka, Nonoichi Ishikawa (JP); Akira Yoshioka, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/062,208

(22) Filed: Mar. 7, 2016

(65) Prior Publication Data
US 2017/0069623 A1 Mar. 9, 2017

(30) Foreign Application Priority Data

Sep. 4, 2015 (JP) ................. 2015-175058

(51) Int. Cl.
*H01L 27/06* (2006.01)
*H01L 29/20* (2006.01)
(Continued)

(52) U.S. Cl.
CPC ...... *H01L 27/0629* (2013.01); *H01L 29/0649* (2013.01); *H01L 29/2003* (2013.01);
(Continued)

(58) Field of Classification Search
CPC ............ H01L 27/0629; H01L 29/2003; H01L 29/66106; H01L 29/207; H01L 29/866;
(Continued)

(56) References Cited

U.S. PATENT DOCUMENTS 7,230,284 B2 * 6/2007 Parikh ................. H01L 29/518
257/192
2009/0166677 A1 7/2009 Shibata et al.
2013/0015498 A1 1/2013 Briere

FOREIGN PATENT DOCUMENTS

CN 103325828 A 9/2013
CN 104821340 A 8/2015
(Continued)

OTHER PUBLICATIONS

TW Office Action dated Oct. 24, 2016 for Application No. 105107390.

*Primary Examiner* — Roy Potter
*Assistant Examiner* — Paul Patton
(74) *Attorney, Agent, or Firm* — Patterson & Sheridan, LLP

(57) ABSTRACT

A semiconductor device includes a first nitride semiconductor layer having a first region, a second nitride semiconductor layer that is on the first nitride semiconductor layer and contains carbon and silicon, a third nitride semiconductor layer that is on the second nitride semiconductor layer and has a second region, a fourth nitride semiconductor layer on the third nitride semiconductor layer, the fourth nitride semiconductor layer having a band gap that is wider than a band gap of the third nitride semiconductor layer, a source electrode that is on the fourth nitride semiconductor layer and is electrically connected to the first region, a drain electrode that is on the fourth nitride semiconductor layer and is electrically connected to the second region, and a gate electrode that is on the fourth nitride semiconductor layer and is between the source electrode and the drain electrode.

17 Claims, 7 Drawing Sheets

(51) Int. Cl.
  *H01L 29/205*    (2006.01)
  *H01L 29/207*    (2006.01)
  *H01L 29/778*    (2006.01)
  *H01L 29/866*    (2006.01)
  *H01L 29/06*    (2006.01)
  *H01L 29/66*    (2006.01)

(52) U.S. Cl.
  CPC .......... *H01L 29/205* (2013.01); *H01L 29/207* (2013.01); *H01L 29/66106* (2013.01); *H01L 29/66462* (2013.01); *H01L 29/7787* (2013.01); *H01L 29/866* (2013.01)

(58) Field of Classification Search
  CPC ........... H01L 29/0649; H01L 29/66462; H01L 29/205; H01L 29/7787
  See application file for complete search history.

(56) References Cited

FOREIGN PATENT DOCUMENTS

| | | |
|---|---|---|
| JP | 5052807 B2 | 10/2012 |
| JP | 2013-201242 | 10/2013 |
| JP | 2015-149324 | 8/2015 |
| TW | 201421648 A | 6/2014 |

\* cited by examiner

SEMICONDUCTOR DEVICE

CROSS-REFERENCE TO RELATED APPLICATION

This application is based upon and claims the benefit of priority from Japanese Patent Application No. 2015-175058, filed Sep. 4, 2015, the entire contents of which are incorporated herein by reference.

FIELD

Embodiments described herein relate generally to a semiconductor device.

BACKGROUND

A semiconductor device structure having a nitride semiconductor layer is a known structure for a semiconductor device. An aluminum gallium nitride (AlGaN) layer, a gallium nitride (GaN) layer, and the like may be employed as this nitride semiconductor layer. A semiconductor device provided with such a nitride semiconductor layer is considered to have promise as a switching element used in a switching power supply, an inverter circuit, and so forth.

When the switching element is used in the switching power supply, the inverter circuit, and so forth, there may be a case where a high voltage is applied to the switching element in an off state and the switching element breaks down due to a phenomenon known as avalanche breakdown. Thus, the switching element is required to have a certain level of avalanche tolerance.

However, if the semiconductor device provided with the nitride semiconductor layer is required to have avalanche tolerance with which the semiconductor device can withstand a high voltage, undesirable results of such a design include an excessively large margin of an element breakdown voltage and an increase in an element area.

DETAILED DESCRIPTION

Embodiments provide a semiconductor device in which an avalanche breakdown does not easily occur.

In general, according to one embodiment, a semiconductor device includes a first nitride semiconductor layer having a first region, a second nitride semiconductor layer that is on the first nitride semiconductor layer and contains carbon and silicon, a third nitride semiconductor layer that is on the second nitride semiconductor layer and has a second region, a fourth nitride semiconductor layer on the third nitride semiconductor layer, the fourth nitride semiconductor layer having a band gap that is wider than a band gap of the third nitride semiconductor layer, a source electrode that is on the fourth nitride semiconductor layer and is electrically connected to the first region, a drain electrode that is on the fourth nitride semiconductor layer and is electrically connected to the second region, and a gate electrode that is on the fourth nitride semiconductor layer and is between the source electrode and the drain electrode.

Hereinafter, embodiments will be described with reference to the drawings. The invention is not limited to the following embodiments.

(First Embodiment)

Figure 1:
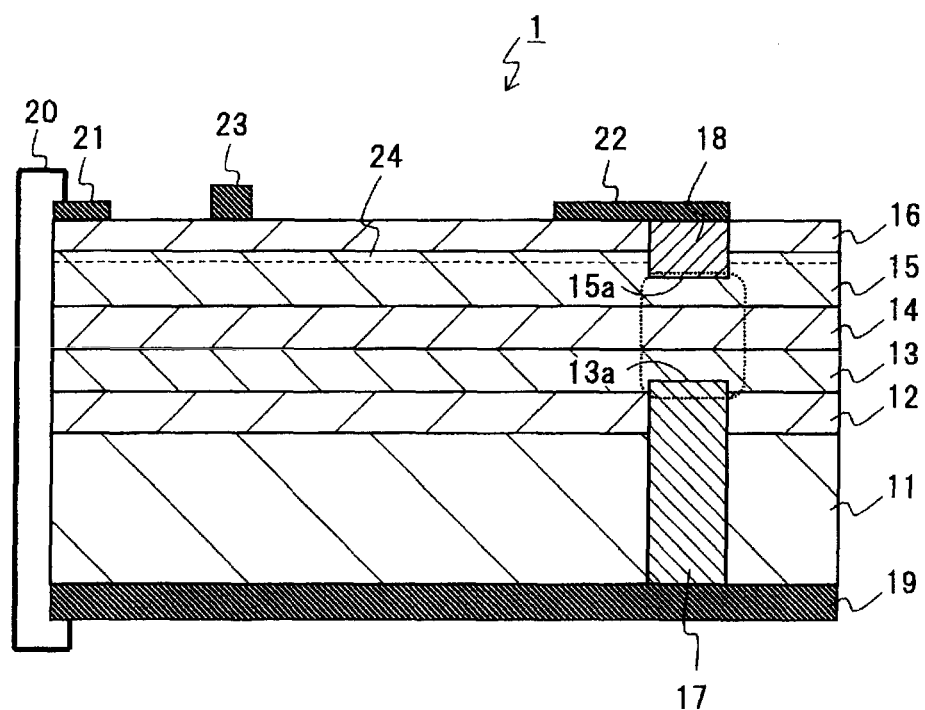
FIG. 1 is a sectional view depicting the schematic structure of a semiconductor device according to a first embodiment.

FIG. 1 is a sectional view depicting the schematic structure of a semiconductor device according to this embodiment. As depicted in FIG. 1, a semiconductor device 1 according to this embodiment includes a conductive substrate 11, a buffer layer 12, a first nitride semiconductor layer 13, a second nitride semiconductor layer 14, a third nitride semiconductor layer 15, a fourth nitride semiconductor layer 16, a first through electrode 17, and a second through electrode 18.

The conductive substrate 11 is a silicon substrate, a silicon carbide (SiC) substrate, or the like. On the back surface of the conductive substrate 11, a back surface electrode 19 is provided. The back surface electrode 19 is electrically connected to a source electrode 21 via wiring 20. On the conductive substrate 11, the buffer layer 12 is provided.

The buffer layer 12, which is, for example, $Al_xGa_{1-x}N$ or a lamination film of AlGaN/GaN, is doped with carbon. As a result, the electrical resistance of the buffer layer 12 is higher than the electrical resistance of the conductive substrate 11. On the buffer layer 12, the first nitride semiconductor layer 13 is provided.

The first nitride semiconductor layer 13 is an i-GaN layer, which is an undoped gallium nitride layer. The first nitride semiconductor layer 13 has a first region 13a which is a contact face at which the first nitride semiconductor layer 13 is in contact with the first through electrode 17. On the first nitride semiconductor layer 13, the second nitride semiconductor layer 14 is provided.

The second nitride semiconductor layer 14 is a GaN layer doped with carbon and silicon. On the second nitride semiconductor layer 14, the third nitride semiconductor layer 15 is provided.

The third nitride semiconductor layer 15 is an i-GaN layer, which is an undoped gallium nitride layer. The third nitride semiconductor layer 15 has a second region 15a which is a contact face at which the third nitride semiconductor layer 15 is in contact with the second through electrode 18. In this embodiment, the second region 15a faces the first region 13a of the first nitride semiconductor layer 13. On the third nitride semiconductor layer 15, the fourth nitride semiconductor layer 16 is provided.

The fourth nitride semiconductor layer 16 is an undoped AlGaN layer whose band gap is wider than the band gap of the third nitride semiconductor layer 15. On the fourth nitride semiconductor layer 16, the source electrode 21, a drain electrode 22, and a gate electrode 23 are provided. Incidentally, in place of a Schottky gate structure as in this embodiment, a metal-insulator-semiconductor (MIS) gate structure or a junction gate structure may be adopted as the structure of the gate electrode 23.

In this embodiment, the third nitride semiconductor layer 15 may be an undoped nitride semiconductor layer having a composition formula: $Al_xGa_{1-x}N$ ($0 \leq X < 1$). Moreover, the fourth nitride semiconductor layer 16 may be an undoped or n-type nitride semiconductor layer having a composition formula: $Al_yGa_{1-y}N$ ($0 < Y \leq 1$, $X < Y$).

The first through electrode 17 passes through the conductive substrate 11 and the buffer layer 12 to thereby electrically connect the first region 13a to the back surface electrode 19. The back surface electrode 19 is electrically connected to the source electrode 21 via the wiring 20. That is, the first region 13a is electrically connected to the source electrode 21 by the first through electrode 17.

The second through electrode 18 passes through the fourth nitride semiconductor layer 16 between the drain electrode 22 and the second region 15a. As a result, the second region 15a is electrically connected to the drain electrode 22.

Figure 2:
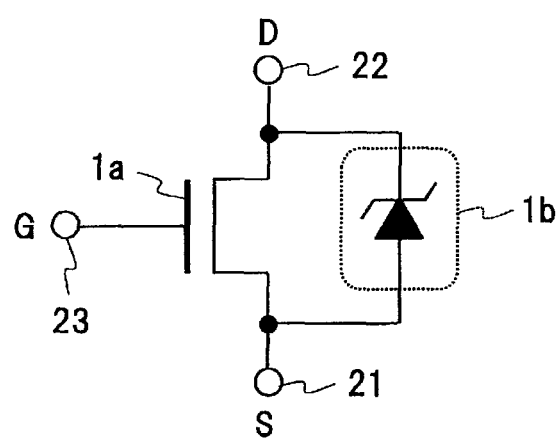
FIG. 2 is an equivalent circuit diagram of the semiconductor device according to the first embodiment.

FIG. 2 is an equivalent circuit diagram of the semiconductor device 1 according to this embodiment. As depicted in FIG. 2, the semiconductor device 1 according to this embodiment includes a field-effect transistor 1a and a Zener diode 1b connected in parallel to the field-effect transistor 1a. Hereinafter, referring back to FIG. 1, the field-effect transistor 1a and the Zener diode 1b will be described.

First, the field-effect transistor 1a will be described. In this embodiment, the third nitride semiconductor layer 15 including an i-GaN layer and the fourth nitride semiconductor layer 16 including an AlGaN layer forma heterostructure. As a result of this heterostructure, a two-dimensional electron gas 24 is generated on the side where the third nitride semiconductor layer 15 is located. The two-dimensional electron gas 24 forms a current path between the drain electrode 22 and the source electrode 21. A current flowing through this current path is controlled by an adjustment of the voltage of the gate electrode 23 lying between the drain electrode 22 and the source electrode 21. As a result, the field-effect transistor 1a is implemented.

Next, the Zener diode 1b will be described. In this embodiment, since the second nitride semiconductor layer 14 is doped with carbon and silicon, the second nitride semiconductor layer 14 corresponds to a P-type semiconductor layer. Moreover, since the first nitride semiconductor layer 13 and the third nitride semiconductor layer 15 each includes an i-GaN layer, these layers each correspond to an N-type semiconductor layer. Thus, an NPN junction is formed between the first region 13a electrically connected to the source electrode 21 and the second region 15a electrically connected to the drain electrode 22. This NPN junction implements the Zener diode 1b.

Figure 3:
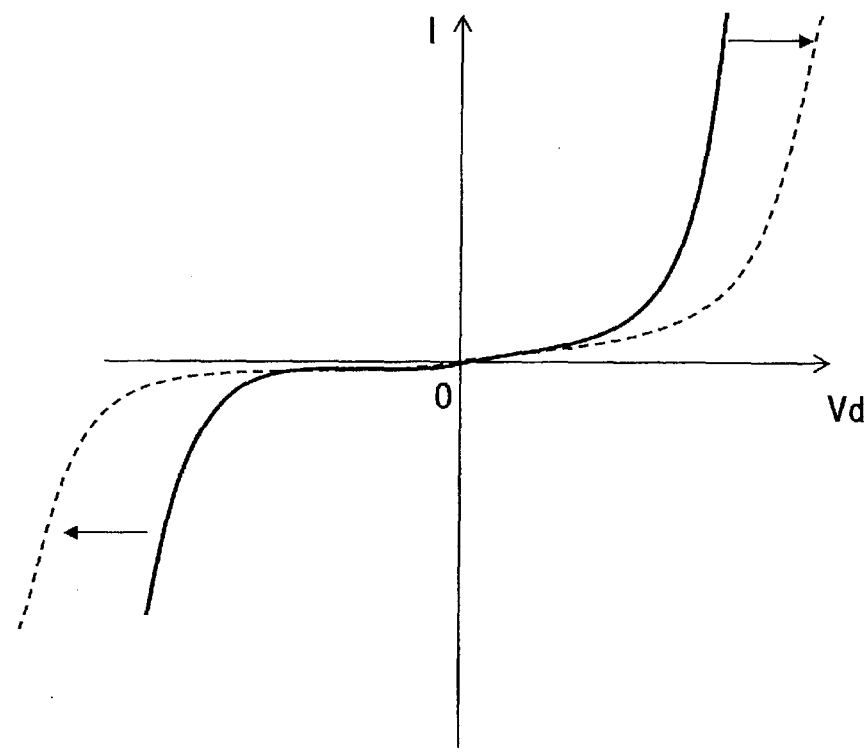
FIG. 3 is a graph indicating the electrical characteristics of a Zener diode depicted in FIG. 2.

FIG. 3 is a graph indicating the electrical characteristics of the Zener diode 1b. In FIG. 3, the horizontal axis represents a voltage between the anode and the cathode. The vertical axis represents a current flowing between the anode and the cathode.

As indicated in FIG. 3, in the Zener diode 1b, when the voltage applied between the anode and the cathode in opposite directions reaches a breakdown voltage, a current suddenly starts to flow. At this time, if the concentration of carbon is increased or the concentration of silicon is reduced, the breakdown voltage rises as a dotted line indicated in FIG. 3. On the other hand, if the concentration of carbon is reduced or the concentration of silicon is increased, the breakdown voltage drops. That is, by adjusting the doping concentrations of two types of impurities (carbon and silicon), the breakdown voltage can be controlled.

Hereinafter, with reference to FIGS. 4A to 6B, processes of producing the semiconductor device 1 according to this embodiment will be described.

Figure 4A:
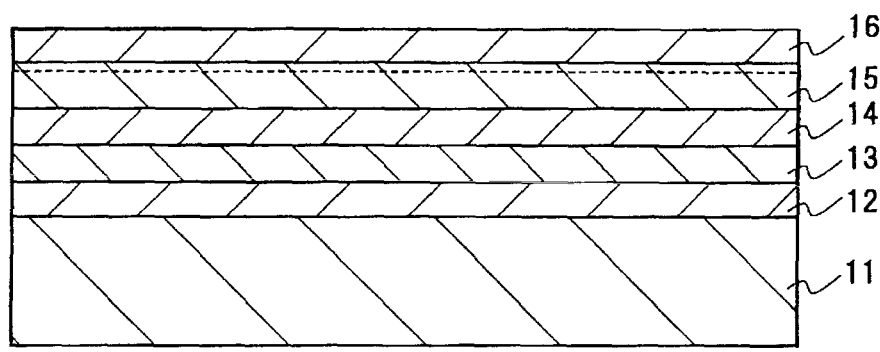
FIG. 4A is a sectional view depicting a process of forming a nitride semiconductor layer.

First, as depicted in FIG. 4A, on the conductive substrate 11, the buffer layer 12, the first nitride semiconductor layer 13, the second nitride semiconductor layer 14, the third nitride semiconductor layer 15, and the fourth nitride semiconductor layer 16 are sequentially formed. In this embodiment, each layer is formed by epitaxial growth.

Figure 4B:
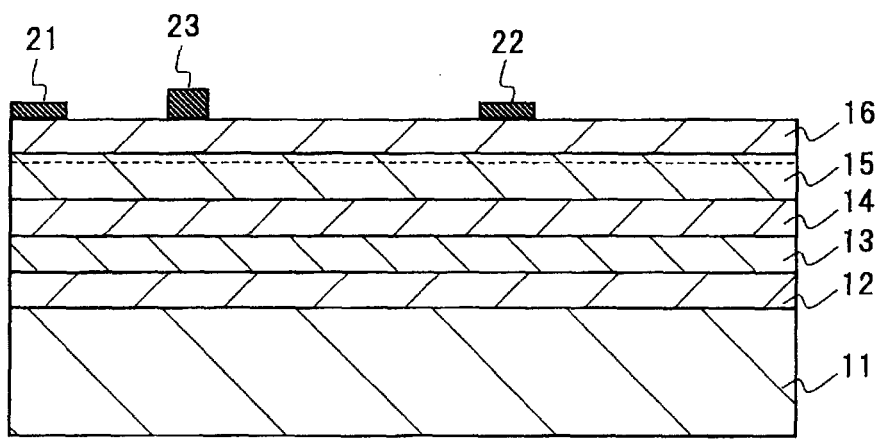
FIG. 4B is a sectional view depicting a process of forming an electrode.

After the above-described layers are formed, as depicted in FIG. 4B, on the fourth nitride semiconductor layer 16, the source electrode 21, the drain electrode 22, and the gate electrode 23 are formed. In this embodiment, the gate electrode 23 is formed between the source electrode 21 and the drain electrode 22.

Figure 5A:
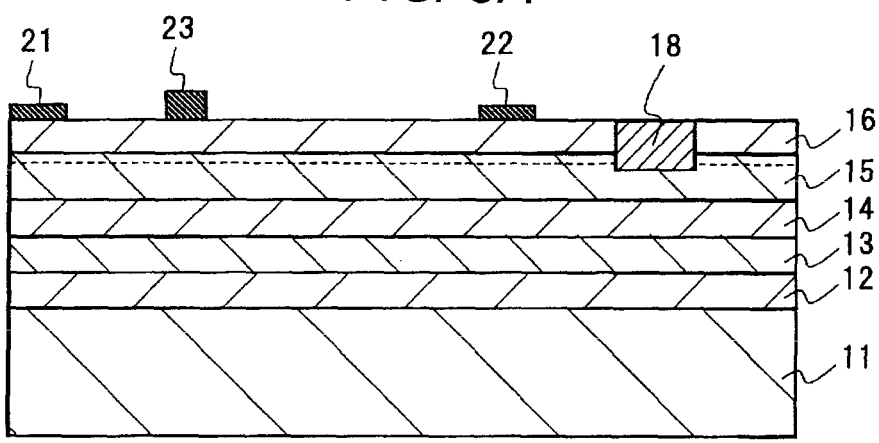
FIG. 5A is a sectional view depicting a process of forming a second through electrode.

After the above-described electrodes are formed, as depicted in FIG. 5A, the second through electrode 18 is formed. In this embodiment, a hole passing through the fourth nitride semiconductor layer 16 is formed by etching, and a conductive member is embedded in this hole. As a result, the second through electrode 18 is completed.

Figure 5B:
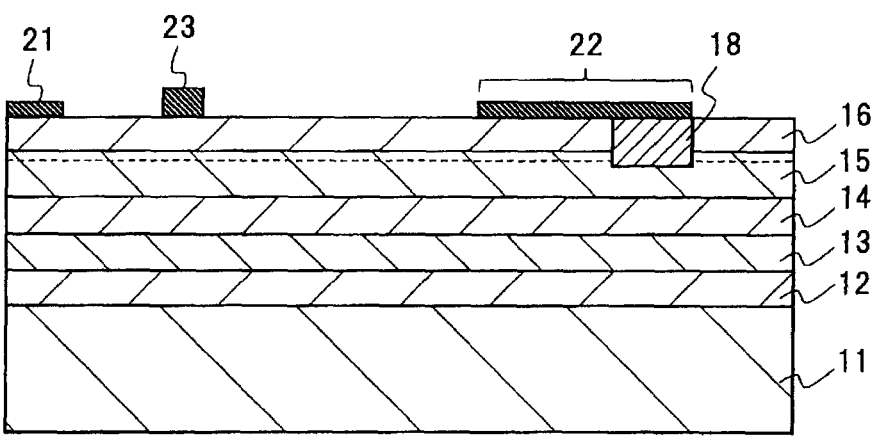
FIG. 5B is a sectional view depicting a process of connecting the second through electrode and a drain electrode.

After the second through electrode 18 is formed, as depicted in FIG. 5B, the second through electrode 18 and the drain electrode 22 are electrically connected. In this embodiment, the drain electrode 22 includes a portion formed by the process depicted in FIG. 4B and a portion formed immediately above the second through electrode 18 by the process depicted in FIG. 5B. That is, in this embodiment, the second through electrode 18 is formed immediately below the drain electrode 22.

Figure 6A:
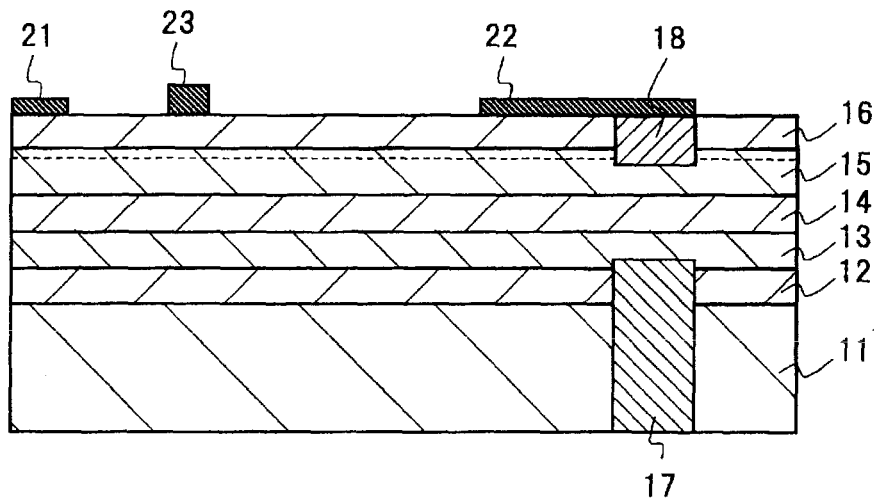
FIG. 6A is a sectional view depicting a process of forming a first through electrode.

After the second through electrode 18 and the drain electrode 22 are electrically connected, as depicted in FIG. 6A, the first through electrode 17 is formed in such a way as to face the second through electrode 18. In this embodiment, a hole passing through the conductive substrate 11 and the buffer layer 12 is formed by etching, and a conductive member is embedded in this hole. As a result, the first through electrode 17 is completed.

Figure 6B:
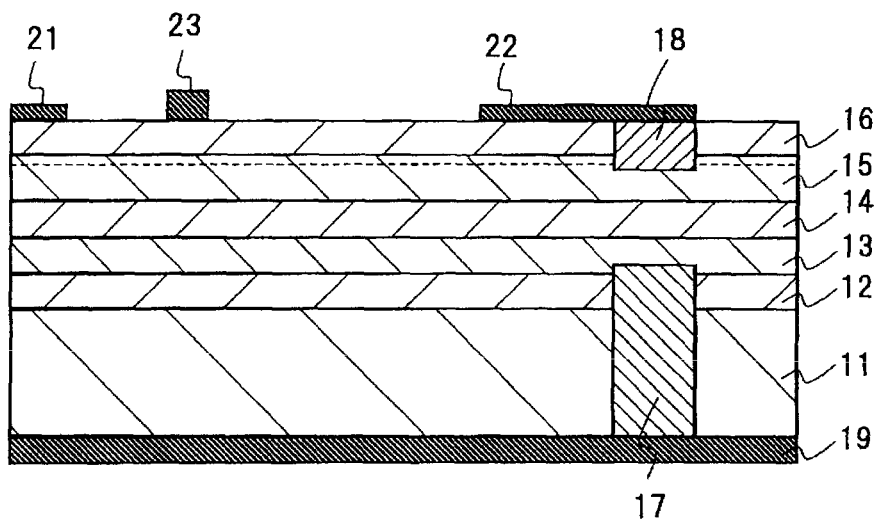
FIG. 6B is a sectional view depicting a process of forming a back surface electrode.

After the first through electrode 17 is formed, as depicted in FIG. 6B, the back surface electrode 19 is formed on the back surface of the conductive substrate 11. Finally, referring back to FIG. 1, the back surface electrode 19 and the source electrode 21 are connected by the wiring 20. As a result the semiconductor device 1 according to this embodiment is completed.

In the above-described semiconductor device 1 according to this embodiment, the first region 13a of the first nitride semiconductor layer 13, the second region 15a of the third nitride semiconductor layer 15, and a part of the second nitride semiconductor layer 14 between the first region 13a and the second region 15a form the Zener diode 1b. In other words, the Zener diode 1b is formed in each of the nitride semiconductor layers forming the field-effect transistor 1a.

In addition, since the second nitride semiconductor layer 14 is doped with carbon and silicon, the breakdown voltage of the Zener diode 1b can be controlled. If this breakdown voltage is set so as to be lower than a voltage at which an avalanche breakdown occurs in the field-effect transistor 1a, a breakdown of the Zener diode 1b occurs before the occurrence of the avalanche breakdown of the field-effect transistor 1a. As a result, the voltage which is applied to the field-effect transistor 1a is clamped, and thus the avalanche breakdown does not easily occur.

Incidentally, there may be a case that on the side of the field-effect transistor 1a, a high voltage is applied between the drain electrode 22 and the back surface electrode 19. However, since the high-resistance buffer layer 12 is provided on the field-effect transistor 1a side, the breakdown voltage of the field-effect transistor 1a is sufficiently ensured.

Moreover, in this embodiment, the first region 13a of the first nitride semiconductor layer 13 and the second region 15a of the third nitride semiconductor layer 15 face each other. Thereby, a stable electric field is formed between the first region 13a and the second region 15a, and thus the breakdown voltage of the Zener diode 1b is stabilized. As a result, the voltage which is applied to the field-effect transistor 1a is clamped more reliably, and thus the likelihood of the occurrence of an avalanche breakdown is further reduced.

Furthermore, in this embodiment, the second through electrode 18 is formed immediately below the drain electrode 22. Thus, there is no need to provide an extra space in which an electrode that electrically connects the drain electrode 22 and the second region 15a is formed. That is, the drain electrode 22 and the second region 15a can be electrically connected without an increase in the element area.

(Second Embodiment)

Figure 7:
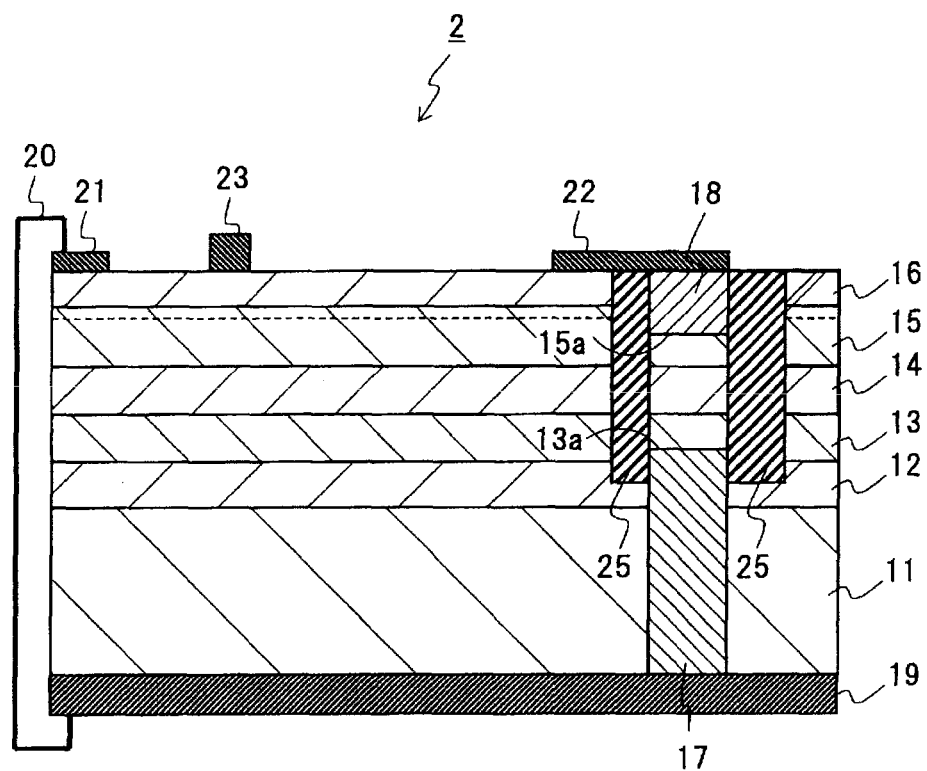
FIG. 7 is a sectional view depicting the schematic structure of a semiconductor device according to a second embodiment.

In the following description of a second embodiment, differences from the first embodiment will be mainly described. FIG. 7 is a sectional view depicting the schematic structure of a semiconductor device according to the second embodiment. Hereinafter, the same component elements as those of the first embodiment described above are identified with the same characters and detailed explanations thereof will be omitted.

As depicted in FIG. 7, a semiconductor device 2 according to this embodiment differs from the semiconductor device 1 according to the first embodiment in that the semiconductor device 2 includes an electrical insulating region 25. The electrical insulating region 25 surrounds the first region 13a, the second region 15a, and a part of the second nitride semiconductor layer 14 between the first region 13a and the second region 15a. In other words, the electrical insulating region 25 surrounds the Zener diode 1b. As a result, the Zener diode 1b is electrically insulated from the field-effect transistor 1a.

Hereinafter, with reference to FIGS. 8A to 9B, processes of producing the semiconductor device 2 according to this embodiment will be described. Of the processes of producing the semiconductor device 2 according to this embodiment, the process of forming the nitride semiconductor layer (see FIG. 4A) and the process of forming the electrode (see FIG. 4B) are the same as those of the first embodiment. Thus, explanations of these processes are omitted, and the other processes will be described.

Figure 8A:
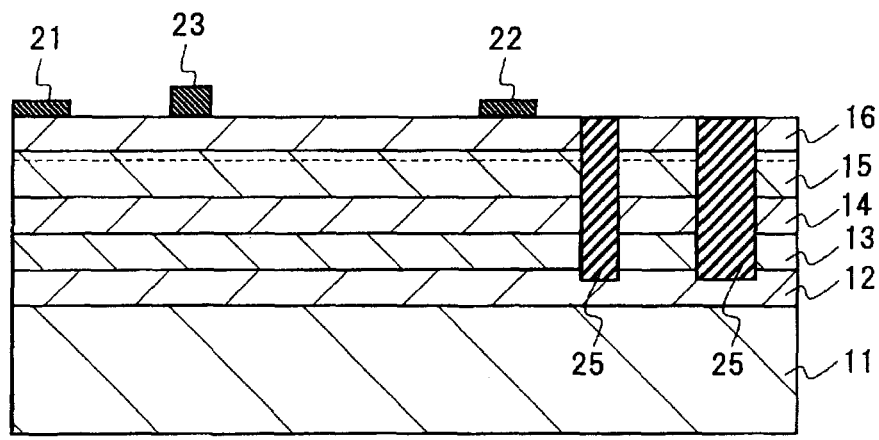
FIG. 8A is a sectional view depicting a process of forming an electrical insulating region.

After the source electrode 21, the drain electrode 22, and the gate electrode 23 are formed on the fourth nitride semiconductor layer 16, as depicted in FIG. 8A, the electrical insulating region 25 is formed. In this embodiment, ions are implanted into a region around the Zener diode 1b from the side where the fourth nitride semiconductor layer 16 is located. Crystal destruction is caused in the region subjected to the ion implantation. As a result of this crystal destruction, the electrical insulating region 25 is completed.

However, the method for forming the electrical insulating region 25 is not limited to the above-described method. Hereinafter, another method for forming the electrical insulating region 25 will be described. First, a groove reaching the first nitride semiconductor layer 13 from the fourth nitride semiconductor layer 16 is formed by etching. Next, an insulator is embedded in this groove. By such a method, the electrical insulating region 25 can also be formed.

Figure 8B:
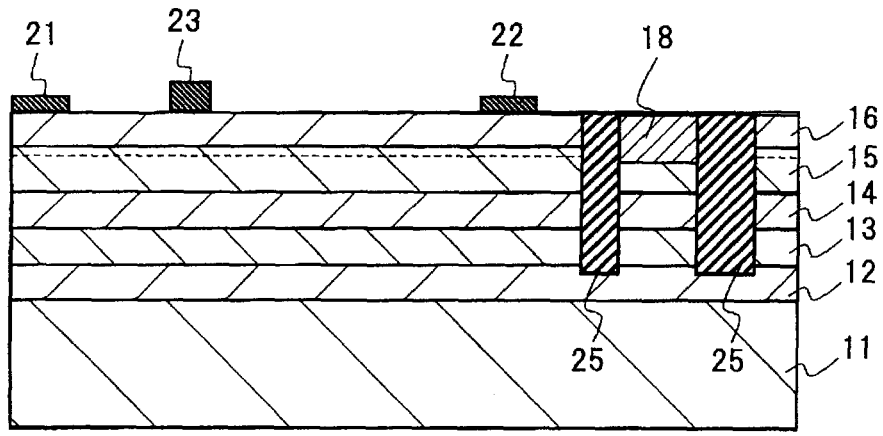
FIG. 8B is a sectional view depicting a process of forming a second through electrode.

After the electrical insulating region 25 is formed, as depicted in FIG. 8B, the second through electrode 18 is formed. In this embodiment, the second through electrode 18 is formed between the electrical insulating regions 25.

Figure 8C:
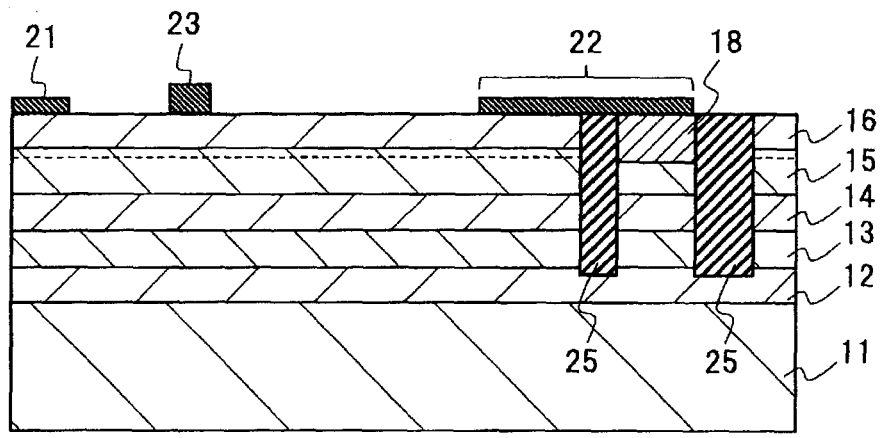
FIG. 8C is a sectional view depicting a process of connecting the second through electrode and a drain electrode.

After the second through electrode 18 is formed, as depicted in FIG. 8C, the second through electrode 18 and the drain electrode 22 are electrically connected. Also in this embodiment, as is the case with the first embodiment, the drain electrode 22 includes a portion formed by the process depicted in FIG. 4B and a portion formed immediately above the second through electrode 18 by the process depicted in FIG. 8C. That is, also in this embodiment, the second through electrode 18 is formed immediately below the drain electrode 22.

Figure 9A:
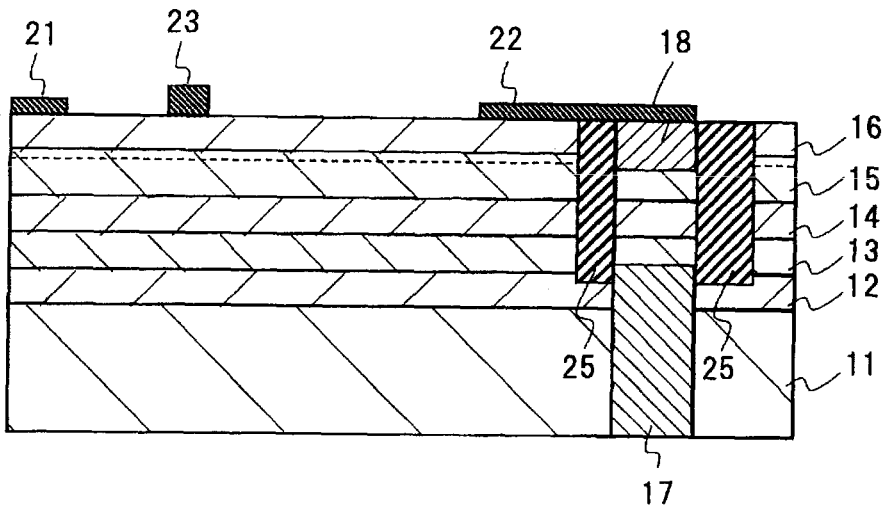
FIG. 9A is a sectional view depicting a process of forming a first through electrode.

After the second through electrode 18 and the drain electrode 22 are electrically connected, as depicted in FIG. 9A, the first through electrode 17 is formed so as to face the second through electrode 18.

Figure 9B:
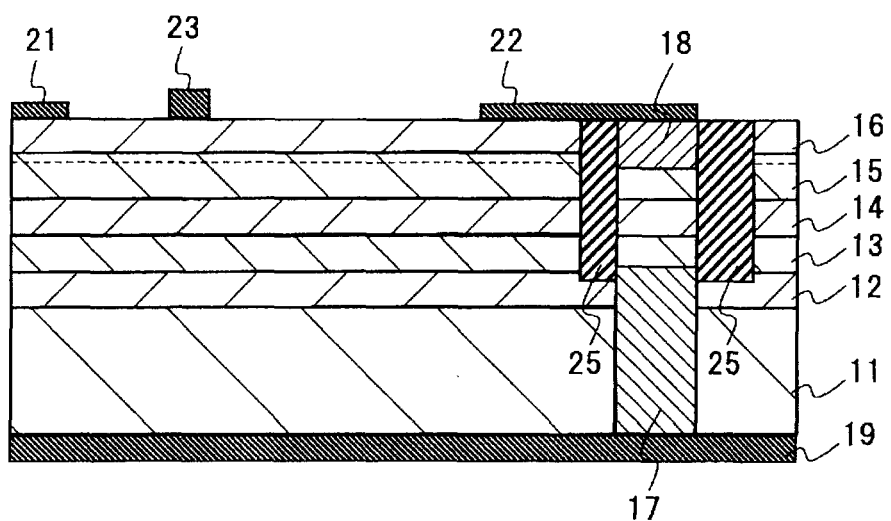
FIG. 9B is a sectional view depicting a process of forming a back surface electrode.

After the first through electrode 17 is formed, as depicted in FIG. 9B, the back surface electrode 19 is formed on the back surface of the conductive substrate 11. Finally, referring back to FIG. 7, the back surface electrode 19 and the source electrode 21 are connected by the wiring 20, whereby the semiconductor device 2 according to this embodiment is completed.

In the above-described semiconductor device 2 according to this embodiment, as is the case with the first embodiment, the Zener diode 1b is formed in each of the nitride semiconductor layers forming the field-effect transistor 1a. In addition, since the second nitride semiconductor layer 14 is doped with carbon and silicon, the breakdown voltage of the Zener diode 1b can be controlled. Thus, a breakdown of the Zener diode 1b can be caused before the occurrence of an avalanche breakdown of the field-effect transistor 1a. As a result, the voltage which is applied to the field-effect transistor 1a is clamped, and thus an avalanche breakdown does not easily occur.

In particular, in this embodiment, the Zener diode 1b is electrically insulated from the field-effect transistor 1a by the electrical insulating region 25. As a result, the operation of the Zener diode 1b is not easily affected by the operation of the field-effect transistor 1a. Thereby the breakdown voltage of the Zener diode 1b is stabilized, and thus the voltage which is applied to the field-effect transistor 1a is clamped more reliably. Therefore, the likelihood of the occurrence of an avalanche breakdown is further reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first nitride semiconductor layer having a first region;
a second nitride semiconductor layer that is on the first nitride semiconductor layer and contains carbon and silicon;
a third nitride semiconductor layer that is on the second nitride semiconductor layer and has a second region;
a fourth nitride semiconductor layer on the third nitride semiconductor layer, the fourth nitride semiconductor layer having a band gap that is wider than a band gap of the third nitride semiconductor layer;
a source electrode that is on the fourth nitride semiconductor layer and is electrically connected to the first region;
a drain electrode that is on the fourth nitride semiconductor layer and is electrically connected to the second region;
a gate electrode that is on the fourth nitride semiconductor layer and is between the source electrode and the drain electrode;
a conductive substrate;
a buffer layer between the conductive substrate and the first nitride semiconductor layer, the buffer layer having an electrical resistance higher than an electrical resistance of the conductive substrate;
a first through electrode passing through the conductive substrate and the buffer layer and electrically connecting the first region and the source electrode; and
a second through electrode passing through the fourth nitride semiconductor layer and electrically connecting the second region and the drain electrode.

2. The semiconductor device according to claim 1, wherein
the first nitride semiconductor layer and the third nitride semiconductor layer each includes a gallium nitride layer, and the second nitride semiconductor layer includes a gallium nitride layer containing carbon and silicon.

3. The semiconductor device according to claim 1, further comprising:
an electrical insulating region that surrounds the first region, the second region, and a part of the second nitride semiconductor layer between the first region and the second region.

4. The semiconductor device according to claim 1, wherein
the first region and the second region face each other.

5. The semiconductor device according to claim 1, wherein the source electrode is electrically connected to the conductive substrate through a conductive wire.

6. The semiconductor device according to claim 1, wherein
the second through electrode is directly below the drain electrode.

7. The semiconductor device according to claim 1, wherein
the gate electrode is a gate of a field effect transistor, and the source and drain electrodes are respectively source and drain of the field effect transistor, and terminals of a Zener diode.

8. The semiconductor device according to claim 7, further comprising:
an electrical insulating region that surrounds the first region, the second region, and a part of the second nitride semiconductor layer between the first region and the second region to electrically isolate the field effect transistor from the Zener diode.

9. The semiconductor device according to claim 7, wherein increasing a concentration of carbon impurity in the second nitride semiconductor layer increases the threshold voltage of the Zener diode.

10. The semiconductor device according to claim 7, wherein decreasing a concentration of silicon impurity in the second nitride semiconductor layer increases the threshold voltage of the Zener diode.

11. A method of adjusting a breakdown voltage of a Zener diode that includes a first nitride semiconductor layer having a first region, a second nitride semiconductor layer that is on the first nitride semiconductor layer and contains carbon and silicon, a third nitride semiconductor layer that is on the second nitride semiconductor layer and has a second region, a fourth nitride semiconductor layer on the third nitride semiconductor layer, the fourth nitride semiconductor layer having a band gap that is wider than a band gap of the third nitride semiconductor layer, a first electrode of the Zener diode that is on the fourth nitride semiconductor layer and is electrically connected to the first region, and a second electrode of the Zener diode that is on the fourth nitride semiconductor layer and is electrically connected to the second region, said method comprising:
increasing the concentration of carbon impurity in the second nitride semiconductor layer to increase the threshold voltage of the Zener diode.

12. The method according to claim 11, wherein the first and second electrode are also respectively source and drain electrodes of a field effect transistor that includes a gate electrode on the fourth nitride semiconductor layer between the source electrode and the drain electrode.

13. The method according to claim 12, wherein an electrical insulating region that surrounds the first region, the second region, and a part of the second nitride semiconductor layer between the first region and the second region is provided to electrically isolate the field effect transistor from the Zener diode.

14. A method of adjusting a breakdown voltage of a Zener diode that includes a first nitride semiconductor layer having a first region, a second nitride semiconductor layer that is on the first nitride semiconductor layer and contains carbon and silicon, a third nitride semiconductor layer that is on the second nitride semiconductor layer and has a second region, a fourth nitride semiconductor layer on the third nitride semiconductor layer, the fourth nitride semiconductor layer having a band gap that is wider than a band gap of the third nitride semiconductor layer, a first electrode of the Zener diode that is on the fourth nitride semiconductor layer and is electrically connected to the first region, and a second electrode of the Zener diode that is on the fourth nitride semiconductor layer and is electrically connected to the second region, said method comprising:
decreasing the concentration of silicon impurity in the second nitride semiconductor layer to increase the threshold voltage of the Zener diode.

15. The semiconductor device according to claim 14, wherein
increasing the concentration of carbon impurity in the second nitride semiconductor layer to increase the threshold voltage of the Zener diode.

16. The method according to claim 14, wherein the first and second electrode are also respectively source and drain electrodes of a field effect transistor that includes a gate electrode on the fourth nitride semiconductor layer between the source electrode and the drain electrode.

17. The method according to claim 16, wherein an electrical insulating region that surrounds the first region, the second region, and a part of the second nitride semiconductor layer between the first region and the second region is provided to electrically isolate the field effect transistor from the Zener diode.

* * * * *